United States Patent
Dasgupta et al.

(10) Patent No.: US 11,671,075 B2
(45) Date of Patent: Jun. 6, 2023

(54) FILM BULK ACOUSTIC RESONATOR (FBAR) DEVICES FOR HIGH FREQUENCY RF FILTERS

(71) Applicant: INTEL CORPORATION, Santa Clara, CA (US)

(72) Inventors: Sansaptak Dasgupta, Hillsboro, OR (US); Bruce A. Block, Portland, OR (US); Paul B. Fischer, Portland, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 16/998,389

(22) Filed: Aug. 20, 2020

(65) Prior Publication Data

US 2020/0382099 A1    Dec. 3, 2020

Related U.S. Application Data

(63) Continuation of application No. 16/327,712, filed as application No. PCT/US2016/054933 on Sep. 30, 2016, now Pat. No. 10,804,879.

(51) Int. Cl.
*H03H 9/205* (2006.01)
*H03H 9/13* (2006.01)
(Continued)

(52) U.S. Cl.
CPC ........ *H03H 9/205* (2013.01); *H03H 9/02007* (2013.01); *H03H 9/02543* (2013.01);
(Continued)

(58) Field of Classification Search
CPC .............. H03H 9/205; H03H 9/02007; H03H 9/02543; H03H 9/02574; H03H 9/13; H03H 9/15; H03H 9/172; H03H 9/02173
See application file for complete search history.

(56) References Cited

U.S. PATENT DOCUMENTS

| | | |
|---|---|---|
| 2005/0140466 A1 | 6/2005 | Larson et al. |
| 2007/0139140 A1 | 6/2007 | Rao et al. |

(Continued)

FOREIGN PATENT DOCUMENTS

WO    2018063378    4/2018

OTHER PUBLICATIONS

International Search Report and Written Opinion received for PCT/US2016/054933, dated May 24, 2017. 19 pages.
(Continued)

*Primary Examiner* — Samuel S Outten
(74) *Attorney, Agent, or Firm* — Sxhwabe, Williamson & Wyatt, P.C.

(57) ABSTRACT

Techniques are disclosed for forming high frequency film bulk acoustic resonator (FBAR) devices having multiple resonator thicknesses on a common substrate. A piezoelectric stack is formed in an STI trench and overgrown onto the STI material. In some cases, the piezoelectric stack can include epitaxially grown AlN. In some cases, the piezoelectric stack can include single crystal (epitaxial) AlN in combination with polycrystalline (e.g., sputtered) AlN. The piezoelectric stack thus forms a central portion having a first resonator thickness and end wings extending from the central portion having a different resonator thickness. Each wing may also have different thicknesses. Thus, multiple resonator thicknesses can be achieved on a common substrate, and hence, multiple resonant frequencies on that same substrate. The end wings can have metal electrodes formed (Continued)

thereon, and the central portion can have a plurality of IDT electrodes patterned thereon.

18 Claims, 7 Drawing Sheets

(51) Int. Cl.
  *H03H 9/17* (2006.01)
  *H03H 9/15* (2006.01)
  *H03H 9/02* (2006.01)
(52) U.S. Cl.
  CPC .......... *H03H 9/02574* (2013.01); *H03H 9/13* (2013.01); *H03H 9/15* (2013.01); *H03H 9/172* (2013.01); *H03H 2009/02173* (2013.01)

(56) References Cited

U.S. PATENT DOCUMENTS

| | | |
|---|---|---|
| 2007/0139141 A1 | 6/2007 | Knollenberg et al. |
| 2013/0106243 A1 | 5/2013 | Reinhardt et al. |
| 2015/0287905 A1 | 10/2015 | Umeda et al. |
| 2015/0333248 A1 | 11/2015 | Moulard |
| 2015/0341016 A1* | 11/2015 | Iwaki ................. H03H 9/02228 333/133 |
| 2016/0182008 A1 | 6/2016 | Bhattacharjee |

OTHER PUBLICATIONS

International Preliminary Report on Patentability received for PCT/US2016/054933, dated Apr. 2, 2019. 13 pages.

\* cited by examiner

FILM BULK ACOUSTIC RESONATOR (FBAR) DEVICES FOR HIGH FREQUENCY RF FILTERS

RELATED APPLICATIONS

This application is a Continuation Application of U.S. patent application Ser. No. 16/327,712, filed on Feb. 22, 2019, which is a U.S. National Stage Entry of PCT Application No. PCT/US2016/054933, filed on Sep. 30, 2016. Each of these applications is herein incorporated by reference in its entirety.

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are some components that are used to make RF filters. An FBAR or TFBAR generally includes a piezoelectric material located between two electrodes and acoustically isolated from the surrounding medium. A typical front end must filter out multiple operating frequencies, which necessitates multiple distinct RF filters, generally one RF filter for each operating frequency to be filtered.

Figure 1:
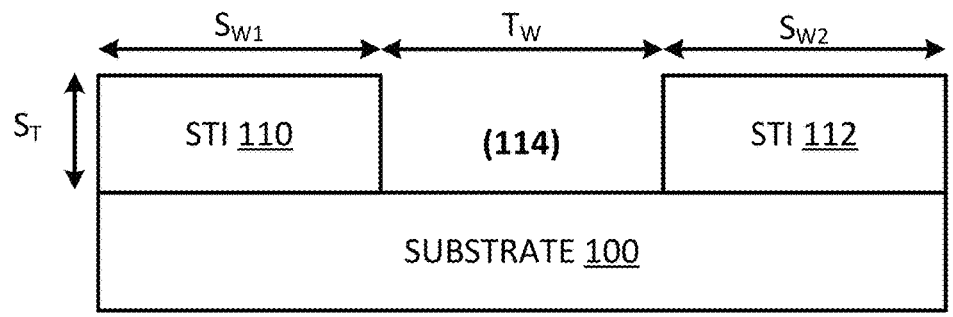
FIG. 1 illustrates an example integrated circuit structure including a substrate and having shallow trench isolation (STI) material deposited thereon to form a trench, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming resonator devices using piezoelectric films that form a structure capable of operating at multiple resonant frequencies. In some cases, the piezoelectric stack of the resonator device may be an epitaxial III-V layer such as an aluminum nitride (AlN) or other group III material-nitride (III-N) compound film (e.g., any combination of one or more of gallium, indium, and aluminum with nitrogen) grown as a part of a III-V material stack, although any other suitable piezoelectric materials can be used. According to an embodiment, STI material is deposited on a substrate material and then selectively etched so as to form a trench between two distinct areas of STI material. Use of a piezoelectric group III-V material stack grown in the trench and then overgrown onto the STI material results in a structure having a thick central portion and thinner wings. Each wing extends laterally out from each end of the central portion and the wings are suspended over the substrate in accordance with an embodiment of the present disclosure. The piezoelectric stack can include a first low-temperature single crystal Aluminum Nitride (AlN) layer and a second high-temperature single crystal AlN layer deposited on the first low-temperature AlN layer, according to an embodiment. The piezoelectric stack can include a first single crystal low-temperature single crystal Aluminum Nitride (AlN) layer, a second high-temperature single crystal AlN layer deposited on the first low-temperature AlN layer and a third polycrystalline AlN layer sputtered on the second high-temperature AlN layer, according to another embodiment. The piezoelectric stack can include a first low-temperature single crystal Aluminum Nitride (AlN) layer, a second polycrystalline AlN layer and a third high-temperature single crystal AlN layer deposited on top of the low-temperature AlN layer and the second polycrystalline AlN layer, according to still another embodiment. Numerous variations and configurations will be apparent in light of this disclosure.

General Overview RF filters continue to be a major factor in the costs of RF front end and the total integrated circuit (IC) area available, particularly in light of 5G mobile telecommunication technology on the horizon. Aluminum nitride (AlN) has been a common piezoelectric film material for FBARs in the RF filter space. However, due to processing constraints, polycrystalline AlN is typically deposited via a sputtering technique after back electrode processing. As will be appreciated in light of this disclosure, sputtered AlN alone is of significantly poorer quality compared to single crystal AlN that is deposited via epitaxial techniques, such as, for example, metal-organic chemical vapor deposition (MOCVD) and molecular-beam epitaxy (MBE). One potential drawback associated with purely sputtered piezoelectric material layers includes difficulty in controlling thickness of the sputtered piezoelectric layer(s).

Thus, and in accordance with one or more embodiments of the present disclosure, techniques are provided for forming high frequency FBAR devices using epitaxially grown piezoelectric elements. The piezoelectric group III-V material stack is deposited in a trench defined by the STI material formed on a substrate and the piezoelectric material is overgrown onto the STI material to form a piezoelectric stack, in accordance with an embodiment of the present disclosure. Due to the overgrowth-based process, the piezoelectric stack has a central portion and wing portions extending laterally from opposing ends of the central portion. This creates at least two different distinct thicknesses on one substrate in accordance with an embodiment of the present disclosure. In some embodiments, the piezoelectric group III-V material stack is formed using multiple deposition processes, including low and high temperature epitaxial depositions of single crystal materials. In some example cases, the piezoelectric group III-V material stack forming process includes non-epitaxial deposition (e.g. sputtering) at certain points in the stack, such as over certain portions of the STI material, as will be appreciated in light of this disclosure.

In some embodiments, the FBAR devices may be used in RF filters or for other suitable applications, such as for duplexers, for multiplexers, for sensors, in conjunction with power amplifiers (PAs), or for low noise amplifiers (LNAs), for example. In some embodiments, the piezoelectric element of the FBAR structure may be epitaxial AlN or any other suitable epitaxial piezoelectric material, such as zinc oxide (ZnO) or lead zirconium titanate (PZT), or other III-V compounds, such as gallium nitride (GaN), indium nitride (InN), or other III-N materials, for example, as will be apparent in light of the present disclosure. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, group III element-nitride (III-N) compounds/materials may be particularly well-suited for the FBAR piezoelectric element, due to III-N materials having high bandgaps and other desirable properties. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlN, AlInN, AlGaN, InGaN, and AlInGaN. In some embodiments, the use of a piezoelectric material deposited in a trench and overgrown onto STI material results in the ability to create multiple resonator thicknesses on a common substrate, as will be further appreciated in light of this disclosure. To this end, a single substrate can be used to have vastly different resonant frequencies, depending on the various piezoelectric group III-V material stack thicknesses provided. Moreover, in some embodiments, at least three resonator devices are defined, including one resonant device at the central portion and one at each wing on opposing ends of the central portion.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate a structure or device configured with an FBAR structure including an epitaxial piezoelectric film as variously described herein. For example, in some embodiments, an epitaxial AlN piezoelectric film may be detected between a top and bottom electrode of an FBAR structure. In some such embodiments, the thickness and/or film quality of the FBAR piezoelectric layer may be indicative that the techniques variously described herein have been used. For example, use of the techniques variously described herein can result in an FBAR including a piezoelectric film (e.g., epitaxial AlN) having multiple thicknesses, each thickness being less than, for instance, 1 micron, or less than 500 nm, or less than 200 nm, or less than 100 nm, or less than 50 nm, or less than 25 nm, or some other suitable maximum thickness as will be apparent in light of the present disclosure. To this end, note that the thicknesses can be set based on the desired frequency ranges to be filtered. Another tell-tale sign of the techniques provided herein is that an angled lateral face will result at a terminus of the winged ends that are formed during the lateral epitaxy overgrowth process, according to some embodiments. This face is angled according to the crystallographic structure and orientation of single crystal material used as the piezoelectric material, in some embodiments. The angle can vary from one embodiment to the next depending on the materials used, but in some example cases is in the range of 40° and 85°, such as between 55° and 62°.

Therefore, the techniques variously described herein can be used to form higher quality FBAR structures and thus higher quality RF filters that are able to have more than one resonant frequency on a same substrate. Numerous benefits, configurations, and variations will be apparent in light of this disclosure.

Architecture and Methodology

FIGS. 1-6A illustrate example integrated circuit structures defining an FBAR device including a piezoelectric stack having at least two different resonator thicknesses on a common substrate, in accordance with an embodiment of the present disclosure. In some embodiments, the techniques for forming FBAR structures having a piezoelectric stack include initially growing STI material on a substrate and selectively etching to form a trench, depositing the piezoelectric stack material in the trench and overgrowing the piezoelectric stack material laterally onto the STI material. In some such embodiments, the stack can include various III-V materials epitaxially grown on a group IV material substrate (e.g., a silicon (Si), silicon carbide (SiC), germanium (Ge), or SiGe substrate), a sapphire substrate, or any other suitable material substrate. For example, in one specific embodiment the III-V material stack may include a first low-temperature epitaxial Aluminum Nitride (AlN) layer and a second high-temperature epitaxial AlN layer deposited on the first low-temperature AlN layer, as will be described in more detail herein. In another specific example, the piezoelectric stack may include a first low-temperature epitaxial AlN layer, a second high-temperature epitaxial AlN layer deposited on the first low-temperature AlN layer, and a third AlN layer sputtered on the second high-temperature AlN layer. In still another specific example, the piezoelectric stack may include a first low-temperature epitaxial AlN layer, a second polycrystalline AlN layer and a third high-temperature epitaxial AlN layer deposited on top of the low-temperature AlN layer and the second polycrystalline AlN layer. As will be appreciated, reference herein to an epitaxial layer refers to that layer as being single crystal (sometimes called monocrystalline). Such single crystal layers are distinct from, for example, amorphous or polycrystalline layers.

FIG. 1 illustrates an example integrated circuit structure including a substrate and having STI material deposited thereon to form a trench, in accordance with an embodiment of the present disclosure. A substrate 100 is provided, which can be a Silicon (111) wafer for example, although other group IV bulk substrate materials can be employed, as will be appreciated in light of the present disclosure. The STI material is blanket deposited on the substrate 100 and then patterned and etched into two areas, including first STI material 110 and second STI material 112. As can be further seen, depositing and selectively etching the STI material forms a trench 114 between the first STI material 110 and second STI material 112, in accordance with an embodiment of the present disclosure. The STI material can be deposited and etched according to any appropriate technique, as will be appreciated. The STI material can be, for example, Silicon Dioxide ($SiO_2$), Silicon Nitride (SiN), Aluminum Oxide ($Al_2O_3$), porous $SiO_2$ or SiN or $Al_2O_3$, Tungsten (W), Molybdenum (Mo), or another appropriate material. Any suitable deposition process may be used for the STI deposition and the STI material may be selected based on the material of substrate 100 (e.g., to provide appropriate isolation and/or passivation), in some embodiments. For example, in the case of a Si substrate 100, STI material 110, 112 may selected to be silicon dioxide ($SiO_2$) or silicon nitride (SiN), in accordance with an example embodiment of the present disclosure.

In accordance with an example embodiment, the STI material 110 can be have an approximate width ($S_{W1}$) of 100 to 200 micrometers (μm), the STI material 112 can have an approximate width ($S_{W2}$) of 100 to 200 μm and the trench 114 can have an approximate width ($T_W$) of 100 to 200 μm.

Although STI material 110, STI material 112 and the trench 114 are shown as having approximately equal widths, this is not necessary, and in some cases the STI material 110, the STI material 112 and the trench 114 may each have varying widths, or in some cases, the width may be identical or nearly identical. The height of the STI material and trench may vary as well, but will effectively define the air gap between the underlying substrate and the overgrowth or wing portions of the piezoelectric material stack, as will be appreciated in light of this disclosure. The trench can be sized to facilitate overgrowth. In a more general sense, the dimensions of the STI and trench can vary from one embodiment to the next and the present disclosure is not intended to be limited to any particular dimensional scheme.

Figure 2A:
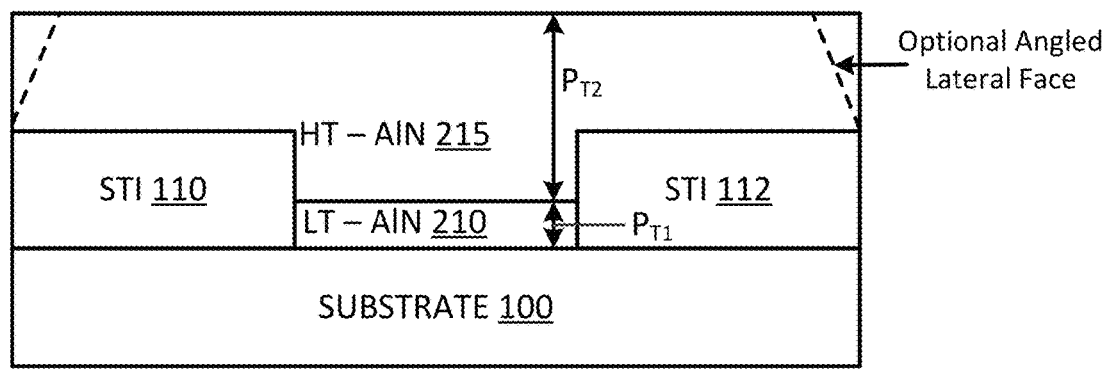
FIGS. 2A-2C illustrate example integrated circuit structures including a piezoelectric stack deposited in the trench formed by the STI material and laterally overgrown onto the STI material to form a central portion and opposing end wings, according to different techniques of deposition, in accordance with various embodiments of the present disclosure.
Figure 2B:
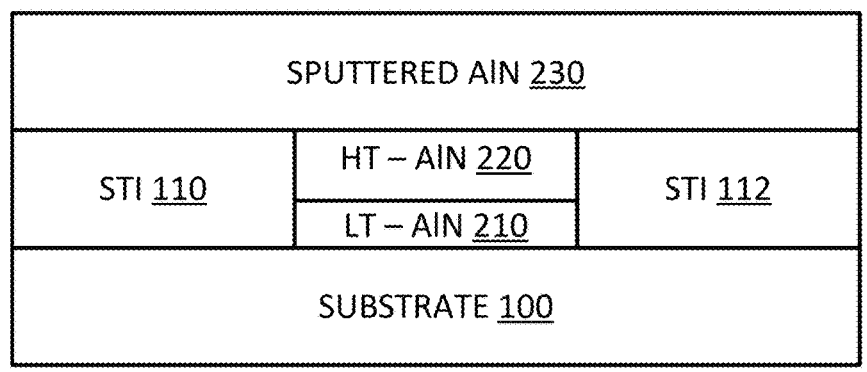
Figure 2C:
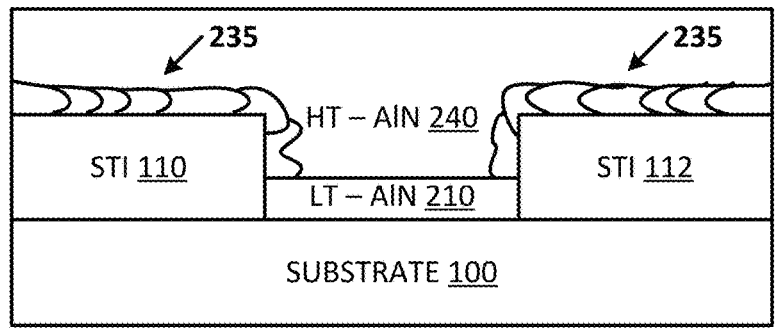

FIGS. 2A-2C illustrate example integrated circuit structures including a piezoelectric stack deposited in the trench and laterally overgrown onto the STI material to form a central portion and opposing end wings, according to different techniques of deposition, in accordance with various embodiments of the present disclosure. The piezoelectric stack includes the central portion and the first wing extends from one end of the central portion, and the second wing that extends from another opposing end of the central portion, for example. The first wing has a first thickness that is approximately equal to a second thickness of the second wing, and the central portion has a third thickness that differs from the first thickness and the second thickness, to thereby allow for multiple resonant frequencies to be achieved on a single substrate.

FIG. 2A illustrates an example integrated circuit structure including a piezoelectric stack deposited in a trench and laterally overgrown onto the STI material to achieve two or more differing thicknesses of piezoelectric material on a substrate, in accordance with an embodiment of the present disclosure. The piezoelectric stack includes a first low-temperature epitaxial AlN layer 210 and a second high-temperature epitaxial AlN layer 215 deposited on the first low-temperature AlN layer 210. The low-temperature (LT) AlN layer 210 is deposited within the trench (114) and the high-temperature (HT) AlN layer 215 is deposited in the trench on the LT-AlN layer and also overgrown onto the STI material 110, 112 to form a central portion of the piezoelectric stack and wings on opposing ends of the central portion. The AlN layers 210, 214 are monocrystalline and deposited by appropriate epitaxial techniques, such as metal organic chemical vapor deposition (MOCVD), molecular beam epitaxy (MBE) or hydride vapor phase epitaxy (HVPE). For high crystalline quality, the first layer is a LT AlN layer 210, where the low temperature is approximately 700-950 degrees Celsius (C), and then a high temperature AlN layer 215 (greater than 950 C) is used to grow the remaining crystalline AlN layer. The LT layer 210 traps dislocation defects and initiates a better nucleation on the Si substrate for AlN Wurzite crystal. It will be appreciated in light of the present disclosure that, although the piezoelectric stack is disclosed as including AlN, any group III-V semiconductor material can be implemented, or any variant thereof, such as Aluminum Scandium Nitride (AlScN).

In accordance with an embodiment, the layer 210 can have a thickness ($P_{T1}$) of approximately 100 nanometers (nm) to 500 nm, and the layer 215 can have a thickness ($P_{T2}$) of approximately 1 μm to 2 μm. The thickness(es) on the wing portions of layer 215 is determined by the desired resonant frequency (or frequencies) of resonator, and can be set accordingly during the highly controllable epitaxial growth process. Note that while both wings are shown as having the same thickness, in other example embodiments, one wing may have a first thickness (to provide one resonant frequency) and the other wing may have a second thickness (to provide a yet another resonant frequency). Further note that, in some embodiments, an angled lateral face will result at a terminus of the winged ends that are formed during the lateral epitaxy overgrowth process, if the overgrowth isn't contained by, for example, a trench or wall. This optional angled lateral face is shown in profile with a dashed line in FIG. 2A, and is angled according to the crystallographic structure and orientation of single crystal material used as the piezoelectric material, in accordance with some embodiments. The angle can vary from one embodiment to the next depending on the materials used, but in some example cases is in the range of 40° and 85°, such as between 55° and 62°. Numerous configurations will be apparent in light of this disclosure.

In some embodiments, the piezoelectric stack can be replaced with a single group III-V semiconductor material rather than a stack of layers of group III-V semiconductor material. For example, the piezoelectric stack in some embodiments can include a uniform AlN layer formed in the trench and overgrown onto the STI material 110, 112 to form the central portion and the opposing end wing portions.

FIG. 2B illustrates an example integrated circuit structure including a piezoelectric stack deposited in a trench and laterally overgrown onto the STI material to achieve two or more thicknesses of piezoelectric material on a substrate, in accordance with another embodiment of the present disclosure. As can be seen, the trench between the STI material 110 and the STI material 112 is filled in by first depositing a single crystal first low-temperature (LT) AlN layer 210, and then depositing a second layer of high-temperature (HT) AlN 220 on the first layer 210. As can be further seen in this example embodiment, a polycrystalline AlN layer 230 is then sputtered on the single crystal AlN layers 210, 220. A device cross-section in STEM would show the morphology illustrated in FIG. 2B having polycrystalline AlN 230 sputtered on the epitaxial single crystal high-temperature AlN 220 and low-temperature AlN 210. The layers 210, 220 can be deposited in the trench and over the STI material using any appropriate epitaxy technique, such as MOCVD, MBE or HVPE. The sputtered AlN layer 230 can be sputtered on the high-temperature AlN layer 220 and the STI material 110, 112 according to any standard sputtering technique.

FIG. 2C illustrates an example integrated circuit structure including a piezoelectric stack deposited in a trench and laterally overgrown onto the STI material to achieve two or more thicknesses of piezoelectric material on a substrate, in accordance with still another embodiment of the present disclosure. As can be seen, the trench is filled in with a first low-temperature (LT) AlN layer 210, and a polycrystalline AlN 235 is selectively sputtered onto the STI material 110, 112, which can be done during or after the deposition of the LT-AlN layer 210 (depending on process chamber capability and compatibility of the two distinct deposition processes). A high-temperature (HT) AlN layer 240 is then deposited on the polycrystalline AlN layer 235 and the LT-AlN layer 210. The AlN layers 210, 240 can be deposited according to any appropriate epitaxial technique, such as MOCVD, MBE or HPVE.

Figure 3:
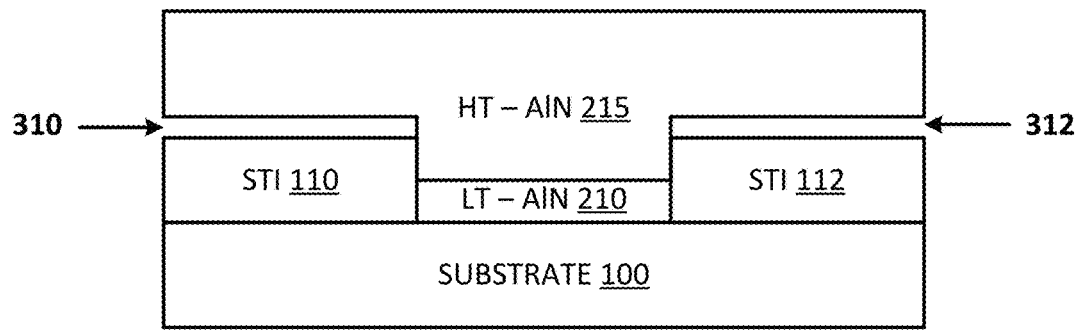
FIG. 3 illustrates an example integrated circuit structure after a portion of the STI material has been released from the piezoelectric layer, creating a cavity between the STI material and the opposing end wings, in accordance with an embodiment of the present disclosure.

FIG. 3 illustrates an example integrated circuit structure after a portion of the STI material has been released from the piezoelectric layer, in accordance with an embodiment of the present disclosure. Partially removing the STI material creates a cavity between the remaining STI material and the opposing end wings, in accordance with an example embodiment of the present disclosure. The piezoelectric layer is partially released from the STI material, for example by using a wet etch, such as hydrofluoric acid, to etch away a portion of the STI material proximate the piezoelectric stack. Note that the etching leaves a cavity 310 between the piezoelectric stack and the STI material 110, and likewise a cavity 312 between the piezoelectric stack and the STI material 112.

Figure 4:
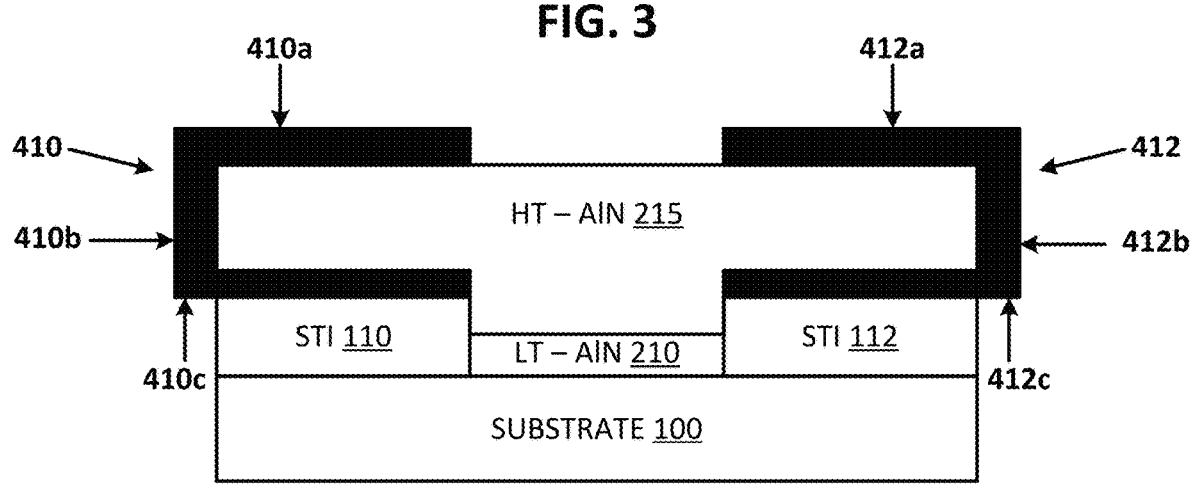
FIG. 4 illustrates an example integrated circuit structure after metal electrodes have been provided on the opposing end wings, in accordance with an embodiment of the present disclosure.

FIG. 4 illustrates an example integrated circuit structure after metal electrodes have been provided on the opposing end wings of the piezoelectric stack, in accordance with an embodiment of the present disclosure. A first end wing of the piezoelectric stack has a metal electrode 410 deposited thereon and a second opposing end wing of the piezoelectric stack has a metal electrode 412 deposited thereon. The metal electrodes 410, 412 can be provided on the piezoelectric stack according to any appropriate deposition technique, such as atomic layer deposition (ALD). The first end wing has a metal electrode 410 deposited on the first end wing such that the metal electrode 410 defines a top electrode 410a, a sidewall electrode 410b, and a bottom electrode 410c. In some embodiments, the bottom electrode portion 410c fills in the cavity 310 between the STI material 110 and the piezoelectric stack. The second opposing end wing has a metal electrode 412 deposited on the second end wing such that the metal electrode 412 defines a top electrode 412a, a sidewall electrode 412b and a bottom electrode 412c. In some embodiments, the bottom electrode portion 412c fills in the cavity 312 between the STI material 112 and the piezoelectric stack. The metal electrodes 410, 412 can be Tungsten (W), Molybdenum (Mo), Titanium Nitride (TiN), or other appropriate metal in accordance with an embodiment of the present disclosure. The thickness of the metal electrode can be, for example, in the range of 100 to 200 nm, although other thicknesses can be implemented in accordance with the techniques disclosed herein.

Figure 5:
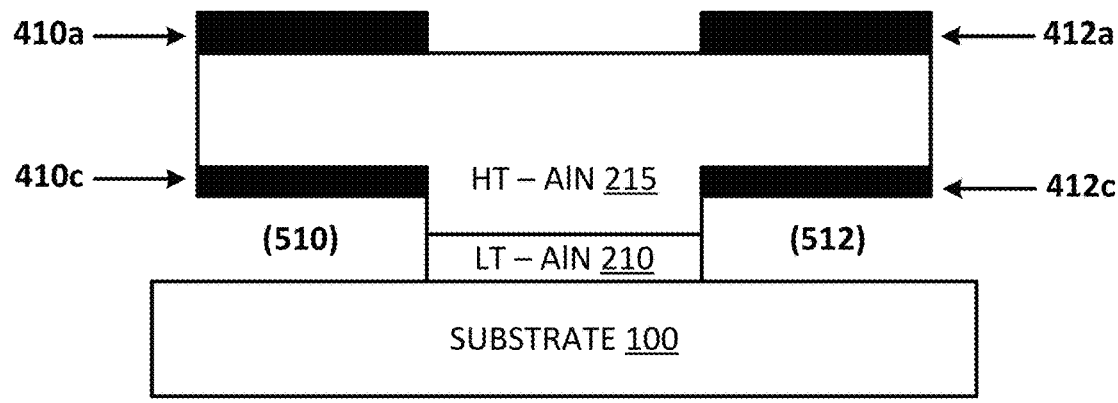
FIG. 5 illustrates an example integrated circuit structure after the STI material has been completely removed, creating a cavity between the metal electrode and the substrate, in accordance with an embodiment of the present disclosure.

FIG. 5 illustrates an example integrated circuit structure after the STI material has been completely removed, creating a cavity between the bottom metal electrode and the substrate, in accordance with an embodiment of the present disclosure. As can be seen, the STI material 110 has now been completely removed, thereby leaving cavity 510 between the metal contact 410b and the substrate 100. Likewise, the STI material 112 has now been completely removed, thereby leaving cavity 512 between the metal contact 412b and the substrate 100. Additionally, as shown in FIG. 5, the sidewall metal contacts have been etched and trimmed, thereby only leaving the top metal electrodes 410a, 410a and bottom metal electrodes 410c, 412c. The metal electrodes 410b, 412b can be etched using any appropriate metal-based etching techniques in accordance with the techniques disclosed herein.

Figure 6:
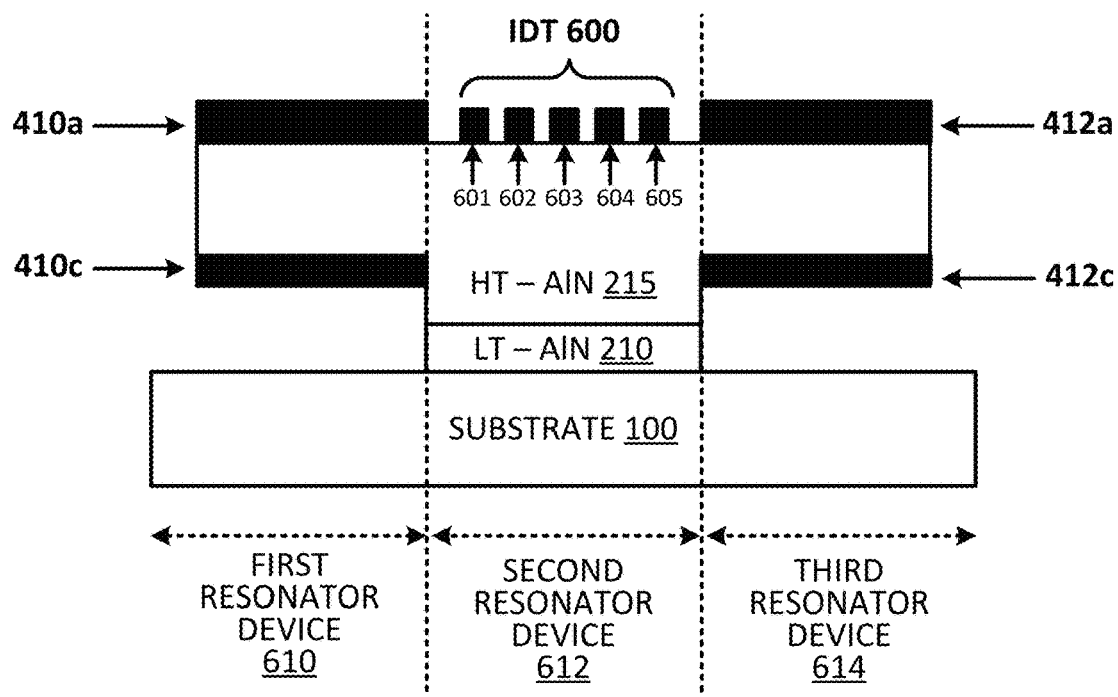
FIG. 6 illustrates an example integrated circuit structure after a plurality of IDT electrodes have been patterned on a top surface of the central portion of the piezoelectric layer, in accordance with an embodiment of the present disclosure.

FIG. 6 illustrates an example integrated circuit structure after a plurality of IDT electrodes have been patterned on a top surface of the central portion of the piezoelectric layer, in accordance with an embodiment of the present disclosure. A plurality of interdigitated (IDT) electrodes 600, including individual electrodes 601, 602, 603, 604 and 605, are patterned on a top surface of the central portion of the piezoelectric stack, in accordance with an embodiment of the present disclosure. The metal electrodes 601, 602, 603, 604 and 605 can be electrode material similar to that used for electrodes 410, 412, such Tungsten (W), Molybdenum (Mo), Titanium Nitride (TiN), or other appropriate metal in accordance with an embodiment of the present disclosure. Note that the structure forms a first resonator device 610 at the first end wing, a second resonator device 612 at the central portion, and a third resonator device 614 at the opposing second end wing. Further recall that each of these resonators can have a unique resonant frequency.

Figure 6A:
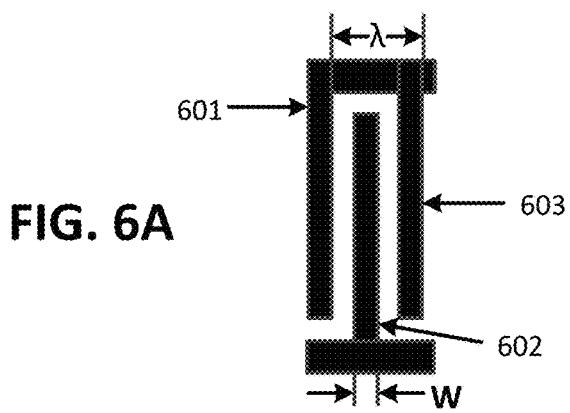
FIG. 6A illustrates a top view of the IDT electrodes of FIG. 6, in accordance with an example embodiment of the present disclosure.

FIG. 6A illustrates a top view of the IDT electrodes of FIG. 6. This shows the top view of the IDT electrodes 601, 602 and 603 shown in cross-section in FIG. 6. The operating filter frequency can be defined by the width (W) and spacing of the IDT electrodes, where the width is equal to the resonant frequency (X) of interest divided by 4, in accordance with an example embodiment of the present disclosure.

Figure 7:
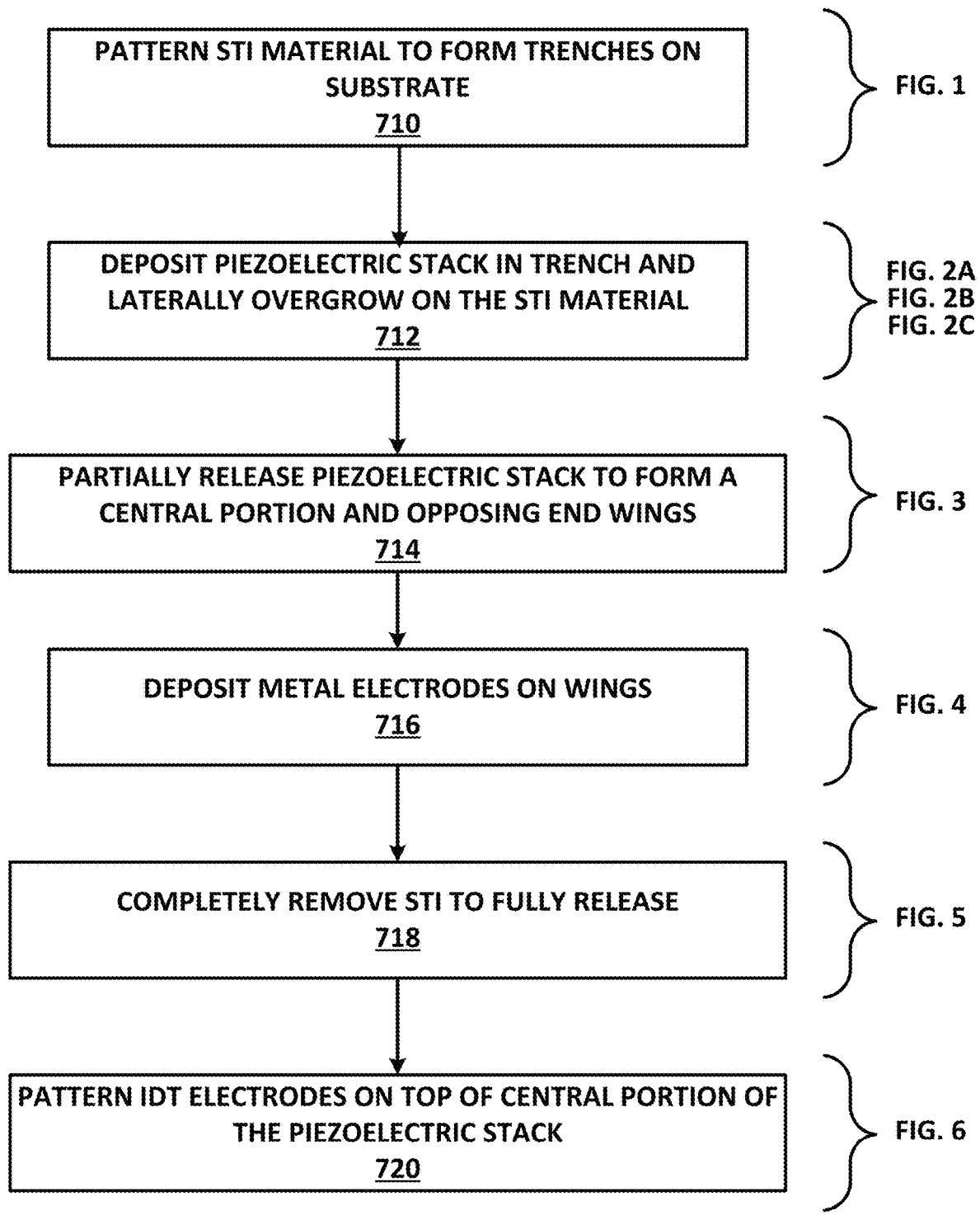
FIG. 7 illustrates a methodology for forming an integrated circuit according to FIGS. 1-6A, in accordance with an example embodiment of the present disclosure.

FIG. 7 illustrates a methodology for forming an integrated circuit according to FIGS. 1-6, in accordance with an example embodiment of the present disclosure. At 710, STI is patterned to form trenches on a substrate, in accordance with an example embodiment of the present disclosure. Refer, for example, to FIG. 1 showing an example integrated circuit structure showing STI material patterned on a substrate to form a trench. At 712, a piezoelectric stack of III-N material(s) is deposited in the trench and laterally overgrown onto the STI material, in accordance with an embodiment of the present disclosure. Refer, for example, to FIG. 2A, 2B or 2C, each illustrating one example structure having a group III-V piezoelectric stack formed in the trench and overgrown laterally onto the STI material, in accordance with the techniques disclosed herein.

At 714, the piezoelectric stack is partially released from the STI material to form a central portion in the trench and opposing end wing portions that extend from opposing ends of the central portion, in accordance with an example embodiment of the present disclosure. The piezoelectric stack is partially released from the STI material by etching out a portion of the STI material, for example by wet or vapor phase etch, in accordance with the teachings of the present disclosure. Refer, for example, to FIG. 3 illustrating an example integrated circuit structure after a portion of the STI material has been etched away and the piezoelectric stack is partially released.

At 716, metal electrodes are deposited on each of the opposing end wings, in accordance with an embodiment of the present disclosure. Refer, for example, to FIG. 4 for an example integrated circuit structure including the metal electrodes deposited on the opposing end wings. The metal electrodes are formed on the top, the side ends, and the bottom of each opposing end wing, according to an example embodiment of the present disclosure.

At 718, the STI material is completely removed to fully release the end wings of the piezoelectric stack from the STI material, in accordance with an example embodiment of the present disclosure. The STI material can be fully removed using any appropriate etching (e.g., wet or vapor phase etch) technique to fully remove the STI material that was deposited on the substrate to form the trench. Refer, for example, to FIG. 5 for an example integrated circuit structure including the STI material completely removed.

At 720, a plurality of IDT electrodes are patterned on a top surface of the central portion of the piezoelectric stack, in accordance with an example embodiment of the present disclosure. Refer, for example, to FIG. 6 for an example integrated circuit structure including the plurality of IDT electrodes patterned on a top surface of the central portion. The resulting structure includes a first resonator device formed by the first metal contacts and first end of the piezoelectric stack, a second resonator device formed by the second metal contacts and the second end of the piezoelectric stack; and a third resonator device formed by the IDT electrodes, central portion of the piezoelectric stack.

Figure 8A:
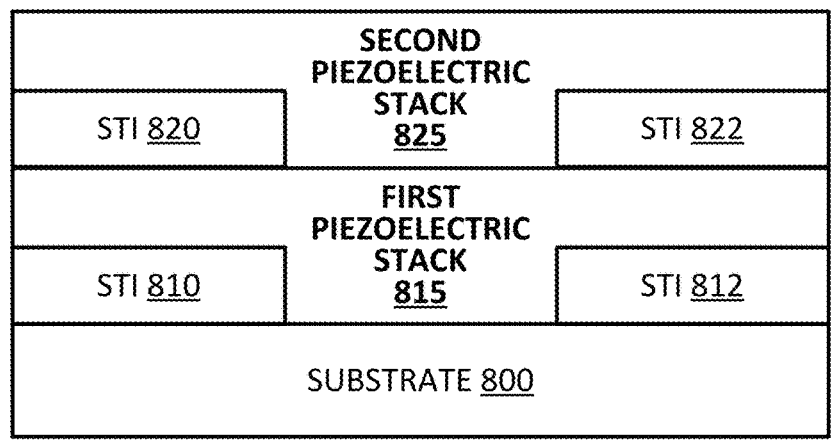
FIG. 8A illustrates an example integrated circuit structure having a first layer formed in a first trench and overgrown onto first STI material, and a second layer formed in a second trench and overgrown onto second STI material, in accordance with another example embodiment of the present disclosure.
Figure 8B:
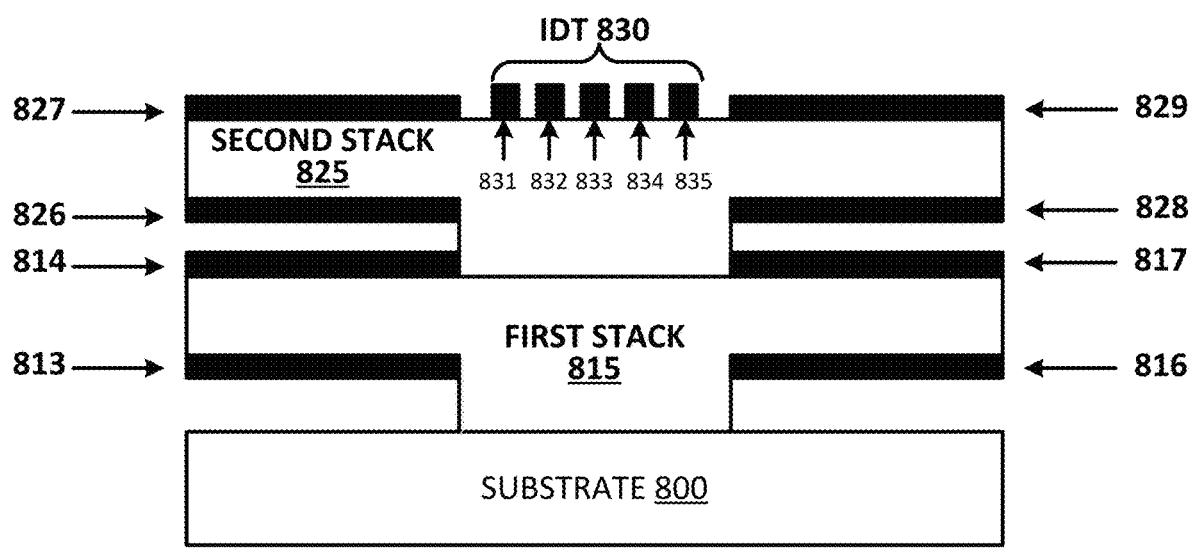
FIG. 8B illustrates an example integrated circuit structure of FIG. 8A, with the STI material removed, metal electrodes formed on the wings of the layers and IDT electrodes formed on the central portion of the second layer, in accordance with an example embodiment of the present disclosure.

FIGS. 8A-8B illustrate example integrated circuit structures including additional layers to achieve a multi-stacked structure, in accordance with an embodiment of the present disclosure. The structure can include a substrate, first STI material deposited on the substrate and etched or otherwise patterned to form a first trench, a first piezoelectric stack formed in the trench and laterally overgrown onto the first STI material, a second STI material deposited on the first piezoelectric stack and etched or otherwise patterned to form a second trench, and a second piezoelectric stack formed in the second trench and overgrown onto the second STI material, in accordance with an embodiment of the present disclosure.

FIG. 8A illustrates an example integrated circuit structure having a first piezoelectric stack formed in a first trench and overgrown onto first STI material, and a second piezoelectric stack formed in a second trench and overgrown onto second STI material, in accordance with another example embodiment of the present disclosure. In this example embodiment, a first piezoelectric stack is formed in accordance with the techniques disclosed herein, where the first piezoelectric stack is formed in the trench formed between the STI material 810, 812, and then overgrown onto the STI material 810, 812. The process is the same up until this point as for a structure having a single piezoelectric stack (as illustrates in FIGS. 1-6A). Then, the epitaxial process is interrupted, another layer of oxide or other suitable STI material is deposited and etched or otherwise patterned to provide STI material 820, 822 on the first piezoelectric stack, and then returned to resume epitaxial growth by depositing the second piezoelectric stack 825. Once the complete stack shown in FIG. 8A is formed, etching and deposition techniques can be employed in accordance with the techniques disclosed herein to arrive at the structure in FIG. 8B.

FIG. 8B illustrates an example integrated circuit structure of FIG. 8A, with the STI material completely removed, metal electrodes formed on the wings of the layers, and IDT electrodes formed on the central portion of the second layer, in accordance with an example embodiment of the present disclosure. The techniques disclosed herein can be applied to the structure in FIG. 8A to arrive at the integrated circuit structure shown in FIG. 8B, where the STI material 810, 812, 820, 822 has been completely removed and metal contacts 813, 814 have been formed on the first wing of the first stack, metal contacts 816, 817 have been formed on the second wing of the first stack, metal contacts 826, 827 have been formed on the first wing of the second stack, and metal contacts 828, 829 have been formed on the second wing of the second stack, in accordance with an example embodiment. The plurality of IDT electrodes 830 have been patterned on a top surface of the central portion. By adding additional piezoelectric stacks, as shown in FIG. 8B, varying resonant frequencies can be achieved, as will be appreciated in light of the present disclosure.

Figure 9A:
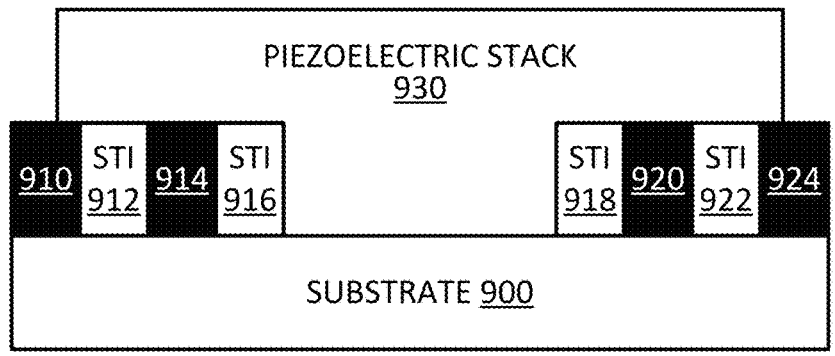
FIG. 9A illustrates an example integrated circuit structure having STI material with interdigitated (IDT) electrodes deposited on a substrate to form a trench, and then a piezoelectric material grown in the trench and overgrown onto the STI material with IDT electrodes, in accordance with another embodiment of the present disclosure.

FIG. 9A illustrates an example integrated circuit structure with STI material having interdigitated (IDT) electrodes within the STI material layer deposited on a substrate to form a trench, and then a piezoelectric material grown in the trench and overgrown onto the STI material with IDT electrodes, in accordance with another embodiment of the present disclosure. In accordance with some embodiments, the STI material deposited on the substrate and then patterned to provide a number of trenches therein. A deposition process is then carried out to provide the interdigitated (IDT)

electrodes within the STI layer. As previously explained, the geometry of the IDT electrodes can be set based on the desired resonant frequency.

As further shown in FIG. 9A, a substrate 900 is provided and STI material 912, 916 having IDT electrodes 910, 914 is provided on a first area of the substrate 900, and STI material 918, 922 having IDT electrodes 920, 924 is provided on a second area of the substrate. The STI material and IDT electrodes 910, 912, 914, 916 and STI material and IDT electrodes 918, 920, 922, 924 form a trench therebetween. The piezoelectric stack 930 can be grown in the trench and then overgrown onto the STI material and IDT electrodes, as shown in FIG. 9A. The deposition process for providing the piezoelectric stack 930 may be multimodal (e.g., multiple temperatures, epitaxy, and sputtering) as will be appreciated in light of this disclosure and can be accomplished in accordance with any number of the example embodiments disclosed herein, including but not limited to those disclosed in FIGS. 2A, 2B and 2C, as well as other piezoelectric stacks, as will be appreciated in light of the present disclosure.

Figure 9B:
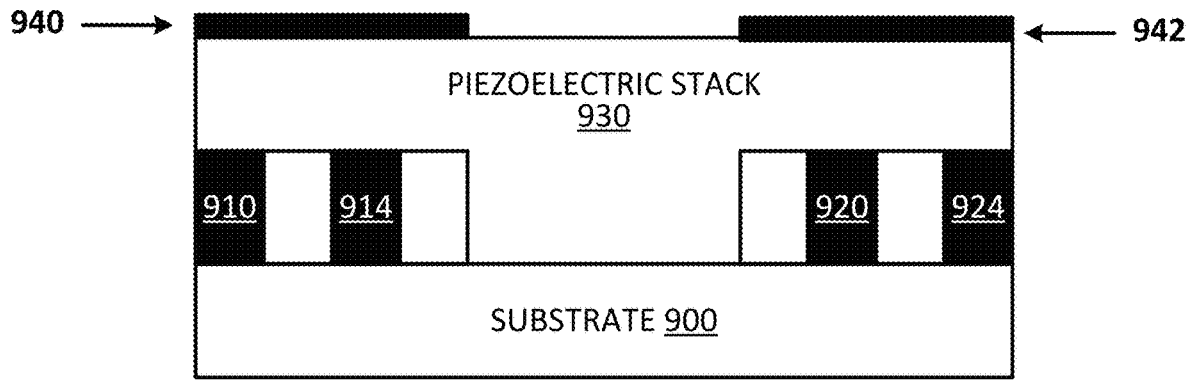
FIG. 9B illustrates the example integrated circuit structure of FIG. 9A, after the STI material has been removed, showing the IDT electrodes in the cavity between the piezoelectric material and the substrate and metal contacts on the top surfaces of the wings of the piezoelectric material, in accordance with an embodiment of the present disclosure.

FIG. 9B illustrates the example integrated circuit structure of FIG. 9A, after the STI material has been removed and metal contacts have been formed, in accordance with an example embodiment. As shown, IDT electrodes 910, 914, 920, 924 are in the cavity between the piezoelectric material and the substrate. The metal contacts are deposited on the top surfaces of the wings of the piezoelectric material, in accordance with an embodiment of the present disclosure. As shown, the metal contacts 940, 942 have been deposited on the top surface of the wings of the piezoelectric stack 930. Also note that the STI material 912, 916, 918, 922 has been completely removed in this embodiment, thereby leaving the exposed IDT electrodes 910, 914, 920, 924 between the piezoelectric stack and the substrate 900. The electrodes 910, 914, 920, 924, 940, and 942 can be, for example, Tungsten, Molybdenum, or any other appropriate metal contact, in accordance with an embodiment of the present disclosure.

Figure 9C:
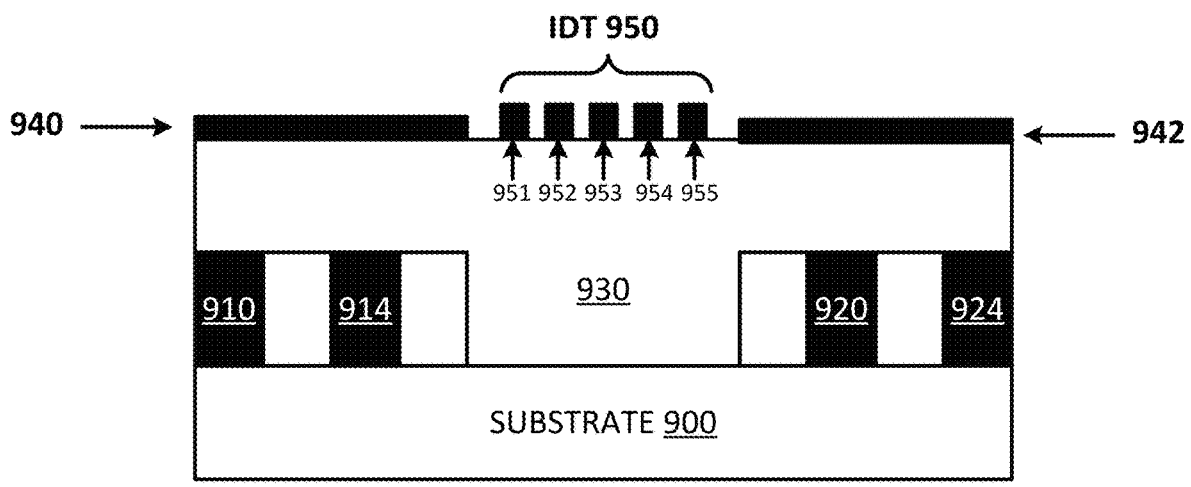
FIG. 9C illustrates the example integrated circuit structure of FIG. 9B, after a plurality of IDT electrodes have been patterned on a top surface of the central portion of the piezoelectric layer, in accordance with an embodiment of the present disclosure.

FIG. 9C illustrates the example integrated circuit structure of FIG. 9B, after a plurality of IDT electrodes have been patterned on a top surface of the central portion of the piezoelectric layer, in accordance with an embodiment of the present disclosure. A plurality of IDF electrodes 950, including individual electrodes 951, 952, 953, 954 and 955, are patterned on a top surface of the central portion of the piezoelectric stack 930, in accordance with an embodiment of the present disclosure. The metal electrodes 951, 952, 953, 954 and 955 can be, for example, electrode material similar to that used for electrodes 940, 942, such as W, Mo, TiN or other appropriate metal material. Similar to the example structure of FIG. 6, the structure of FIG. 9C provides three distinct resonator devices, with a first resonator device at the first wing and having a top electrode 940 and bottom IDT electrodes 910, 914; a second resonator device in the central portion, having IDT 950 as the top electrode; and a third resonator device at the second wing and having a top electrode 942 and bottom IDT electrodes 920, 924. Further recall that each of these resonators can have a unique resonant frequency, as will be appreciated in light of the present disclosure.

Example System

Figure 10:
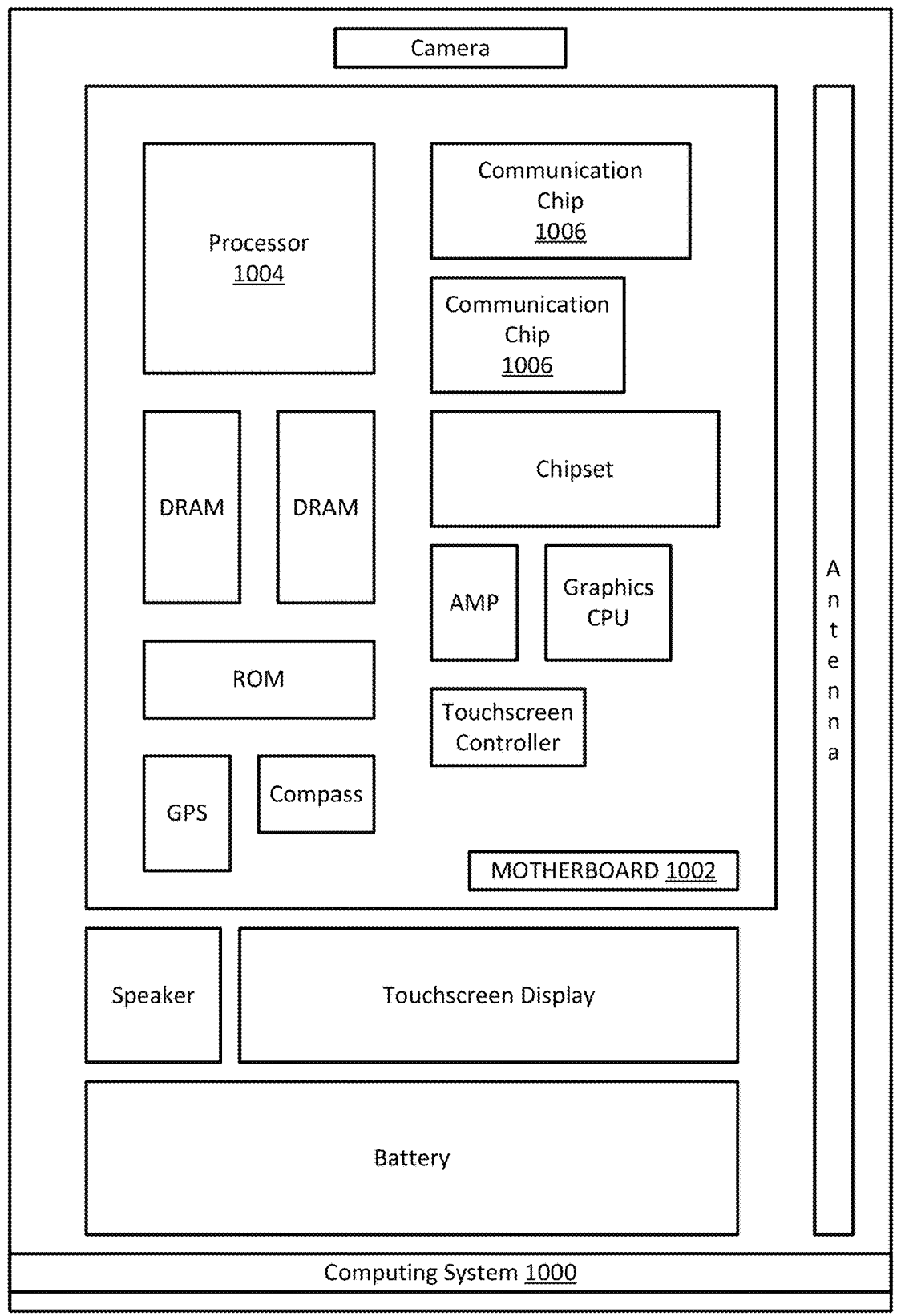
FIG. 10 illustrates a computing system implemented with integrated circuit structures or devices formed using the techniques disclosed herein, in accordance with an embodiment of the present disclosure.

FIG. 10 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more FBAR structures as variously described herein (e.g., FBAR including a relatively thin epitaxial AlN piezoelectric element), and such FBAR structures may be included in one or more RF filters. Further, such RF filters may be configured to be high frequency filters (e.g., operating at greater than 1, 2, 3, 4, or 5 GHz). Further still, such RF filters may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes a resonator device comprising: a substrate; a piezoelectric stack of group III-V semiconductor material layers comprising a central portion deposited over the substrate, a first wing suspended over a first end of the substrate, and a second wing suspended over a second end of the substrate, the second end of the substrate opposite the first end of the substrate; a first metal electrode provided on a first top surface of the first wing; a second metal electrode provided on a first bottom surface of the first wing; a third metal electrode provided on a second top surface of the second wing; a fourth metal electrode provided on a second bottom surface of the second wing; and a plurality of IDT electrodes patterned on a top surface of the central portion.

Example 2 includes the subject matter of Example 1, wherein a first thickness of the central portion is different than a thickness of both the first wing and the second wing.

Example 3 includes the subject matter of Example 2, wherein the first wing has a second thickness and the second wing has a third thickness, and each of the first, second, and third thicknesses is different.

Example 4 includes the subject matter of any of Examples 1-3, wherein the piezoelectric stack includes at least one of: a layer of Aluminum Nitride (AlN) and a layer of Aluminum Scandium Nitride (AlScN).

Example 5 includes the subject matter of any of Examples 1-4, wherein the piezoelectric stack includes a first Aluminum Nitride (AlN) layer and a second AlN layer deposited on the first AlN layer, the second AlN layer being distinct from the first AN layer.

Example 6 includes the subject matter of any of Examples 1-5, wherein the piezoelectric stack includes a first single crystal Aluminum Nitride (AlN) layer, a second single crystal AlN layer deposited on the first AlN layer and a third polycrystalline AlN layer on the second single crystal AlN layer, each of the first, second, and third AlN layers being distinct from one another.

Example 7 includes the subject matter of any of Examples 1-6, wherein the piezoelectric stack includes a first single crystal Aluminum Nitride (AlN) layer, a second polycrystalline AlN layer, and a third single crystal AlN layer deposited on top of the first single crystal AlN layer and the second polycrystalline AN layer.

Example 8 includes the subject matter of any of Examples 1-7, and further includes a second piezoelectric stack deposited between the first piezoelectric stack and the substrate.

Example 9 includes the subject matter of any of Examples 1-8, wherein the second metal electrode and the fourth metal electrode each comprise a plurality of interdigitated (IDT) electrodes.

Example 10 includes a radio frequency (RF) communications integrated circuit device including the subject matter of any of Examples 1-9.

Example 11 includes a resonator device comprising: a substrate; an piezoelectric stack of group III-V semiconductor material having a first portion grown on the substrate and a second portion suspended above the substrate; a first metal electrode deposited on a top surface of the second portion; and a second metal electrode deposited on a bottom surface of the second portion, wherein the first metal electrode and the second metal electrode together with the second portion of the piezoelectric stack form a first resonator structure having a first resonant frequency; and a plurality of interdigitated (IDT) electrodes patterned on a top surface of the first portion of the piezoelectric stack, wherein the IDT electrodes and the first portion of the piezoelectric stack form a second resonator structure having a second resonant frequency different from the first resonant frequency.

Example 12 includes the subject matter of Example 11, wherein the piezoelectric stack of group III-V semiconductor material further includes a third portion suspended above the substrate, extending from the first portion in a direction opposite from a second direction in which the second portion extends, and wherein the third portion includes a third electrode deposited on a top surface of the third portion and a fourth electrode deposited on a bottom surface of the third portion, wherein the third electrode and the fourth electrode together with the third portion of the piezoelectric stack form a third resonator structure.

Example 13 includes the subject matter of any of Example 12, wherein the third resonator structure has a third resonant frequency different from the first and second resonant frequencies.

Example 14 includes the subject matter of any of Examples 11-13, wherein a first thickness of the first portion is different than a second thickness of the second portion.

Example 15 includes the subject matter of any of Examples 11-14, wherein the plurality of IDT electrodes, together with a bottom electrode, are configured to allow resonator device to operate at multiple operating frequencies.

Example 16 includes the subject matter of any of Examples 11-15, wherein the piezoelectric stack includes at least one layer of Aluminum Nitride (AlN).

Example 17 includes the subject matter of any of Examples 11-16, wherein the piezoelectric stack includes a first low-temperature Aluminum Nitride (AlN) layer and a second high-temperature AlN layer deposited on the first low-temperature AlN layer.

Example 18 includes the subject matter of any of Examples 11-17, wherein the piezoelectric stack includes a first low-temperature Aluminum Nitride (AlN) layer, a second high-temperature AlN layer deposited on the first low-temperature AlN layer and a third AlN layer sputtered on the second high-temperature AlN layer.

Example 19 includes the subject matter of any of Examples 11-18, wherein the piezoelectric stack includes a first low-temperature Aluminum Nitride (AlN) layer, a second polycrystalline AlN layer and a third high-temperature AlN layer deposited on top of the low-temperature AlN layer and the second polycrystalline AlN layer.

Example 20 includes the subject matter of any of Examples 11-19, and further includes a second piezoelectric stack deposited between the piezoelectric stack and the substrate.

Example 21 includes the subject matter of any of Examples 11-20, wherein the second metal electrode comprises a plurality of interdigitated (IDT) electrodes.

Example 22 includes a radio frequency (RF) communications integrated circuit device including the subject matter of any of Examples 11-21.

Example 23 is a method of forming a resonator device, the method comprising: patterning STI material on a substrate to form at least one trench between a first STI material and a second STI material; depositing a piezoelectric stack of group III-V semiconductor material in the trench and laterally onto the STI material, the piezoelectric stack including a central portion in the trench, a first wing overflowed from the trench and extending in a first direction, and a second wing overflowed from the trench and extending in a second direction opposite the first direction; depositing a first metal electrode on a top surface of the first wing, a second metal electrode on a bottom surface of the first wing, a third metal electrode on a top surface of the second wing, and a fourth metal electrode on a bottom surface of the second wing; removing the STI material to fully release the piezoelectric stack; and providing a plurality of inter-digitated (IDT) metal electrodes on a top surface of the central portion, to thereby provide a resonator device having a first resonator structure including the first wing, a second resonator structure including the second wing, and a third resonator structure including the central portion.

Example 24 includes the subject matter of Example 23, and further includes partially releasing the piezoelectric stack from the STI material prior to depositing the first metal electrode, the second metal electrode, the third metal electrode and the fourth metal electrode.

Example 25 includes the subject matter of any of Examples 23-24, wherein patterning the STI material comprises depositing a blanket layer of STI material and etching the blanket layer of STI material to form the at least one trench between the first STI material and the second STI material.

Example 26 includes the subject matter of any of Examples 23-25, wherein the depositing the piezoelectric stack comprises depositing a first low-temperature Aluminum Nitride (AlN) layer and depositing a second high-temperature AlN layer on the first low-temperature AlN layer.

Example 27 includes the subject matter of any of Examples 23-26, wherein the depositing the piezoelectric stack comprises depositing a first low-temperature single crystal Aluminum Nitride (AlN) layer, depositing a second high-temperature single crystal AlN layer on the first low-temperature AlN layer, and sputtering a third polycrystalline AlN layer on the second high-temperature AlN layer.

Example 28 includes the subject matter of any of Examples 23-27, wherein the depositing the piezoelectric stack comprises depositing a first low-temperature single crystal Aluminum Nitride (AlN) layer, sputtering a second polycrystalline AlN layer, and depositing a third high-temperature single crystal AlN layer on top of the low-temperature AlN layer and the second polycrystalline AlN layer.

Example 29 includes the subject matter of any of Examples 23-28, wherein the depositing the metal electrodes is performed using atomic layer deposition (ALD).

Example 30 includes the subject matter of any of Examples 23-29, wherein the removing the STI material is performed by etching out the STI material.

Example 31 includes the subject matter of any of Examples 23-30, wherein the providing the plurality of IDT electrodes comprises patterning the plurality of IDT electrodes on the top surface of the central portion.

Example 32 includes the subject matter of any of Examples 23-31, and further includes depositing a fifth metal electrode on a first sidewall of the first wing and a sixth metal electrode on a second sidewall of the second wing.

Example 33 includes the subject matter of Examples 32, and further includes, prior to providing the plurality of IDT electrodes, etching the fifth metal electrode and the sixth metal electrode.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising: a substrate;
    a structure including one or more layers, each layer of the one or more layers comprising one or more corresponding group III-V piezoelectric semiconductor materials, the structure having a first portion on the substrate and a second portion suspended above the substrate, the second portion having a sidewall;
    a first electrode on a top surface of the second portion of the structure;
    a second electrode on a bottom surface of the second portion of the structure, the second electrode having a sidewall in vertical alignment with the sidewall of the second portion of the structure; and
    a plurality of electrodes over a top surface of the first portion of the structure.

2. The integrated circuit of claim 1, wherein the structure further includes a third portion suspended above the substrate, such that at least a section of the first portion is laterally between the second and third portions, and the integrated circuit further comprises a third electrode on a top surface of the third portion and a fourth electrode on a bottom surface of the third portion.

3. The integrated circuit of claim 2, wherein:
the second portion extends from the first portion in a first direction;
the third portion extends from the first portion in a second direction opposite the first direction;
the plurality of electrodes over the top surface of the first portion of the structure and the first portion of the structure are part of a first resonator structure having a first resonant frequency; and
the third electrode, the fourth electrode, and the third portion of the structure are part of a second resonator structure having a second resonant frequency different from the first resonant frequency.

4. The integrated circuit of claim 2, wherein an average thickness of the first portion in the vertical direction is different from an average thickness of the second portion in the vertical direction, and/or the average thickness of the first portion in the vertical direction is different from an average thickness of the third portion in the vertical direction.

5. The integrated circuit of claim 2, further comprising:
a first cavity between the second electrode and the substrate; and
a second cavity between the fourth electrode and the substrate.

6. The integrated circuit of claim 1, wherein the first electrode, the second electrode, and the second portion of the structure are part of a first resonator structure having a first resonant frequency.

7. The integrated circuit of claim 6, wherein the plurality of electrodes over the top surface of the first portion of the structure and the first portion of the structure are part of a second resonator structure having a second resonant frequency different from the first resonant frequency.

8. The integrated circuit of claim 1, wherein the structure is a first structure, wherein the one or more layers is one or more first layers, and wherein the integrated circuit further comprises:
a second structure including one or more second layers, each layer of the one or more second layers comprising one or more corresponding group III-V piezoelectric semiconductor material, the second structure having a third portion on the first structure and a fourth portion suspended above the first structure;
a third electrode on a top surface of the fourth portion of the second structure; and
a fourth electrode on a bottom surface of the fourth portion of the second structure, wherein the plurality of electrodes over the top surface of the first portion of the structure are over a top surface of the third portion of the second structure.

9. The integrated circuit of claim 8, wherein:
the second structure has a fifth portion suspended above the first structure and extending from the third portion in a direction different than the fourth portion;
a fifth electrode on a top surface of the fifth portion of the second structure; and
a sixth electrode on a bottom surface of the fifth portion of the second structure.

10. The integrated circuit of claim 1, wherein the plurality of electrodes over the top surface of the first portion of the structure comprises a plurality of interdigitated (IDT) electrodes.

11. The integrated circuit of claim 1, wherein the plurality of electrodes over the top surface of the first portion of the structure includes a first interdigitated (IDT) electrode spaced from a second IDT electrode.

12. The integrated circuit of claim 1, wherein the one or more layers includes at least a first layer comprising a single crystal material, and a second layer comprising a polycrystalline material.

13. The integrated circuit of claim 1, wherein the one or more layers includes a first layer comprising a single crystal material, a second layer comprising a polycrystalline material, and a third layer comprising a single crystal material, the third layer over the first layer and the second layer.

14. The integrated circuit of claim 1, wherein the one or more layers includes at least one layer comprising aluminum and nitrogen.

15. The integrated circuit of claim 1, wherein the one or more layers includes:
a layer comprising aluminum and nitrogen; and
a layer comprising aluminum, scandium, and nitrogen.

16. A radio frequency (RF) communications device comprising the integrated circuit of claim 1.

17. An integrated circuit comprising: a substrate;
a structure including one or more layers, each layer of the one or more layers comprising one or more corresponding group III-V piezoelectric semiconductor materials, wherein the one or more layers includes at least a first layer comprising a single crystal material, and a second layer comprising a polycrystalline material, the structure having a first portion on the substrate and a second portion suspended above the substrate;
a first electrode on a top surface of the second portion of the structure;
a second electrode on a bottom surface of the second portion of the structure; and
a plurality of electrodes over a top surface of the first portion of the structure.

18. An integrated circuit comprising:
a substrate;
a structure including one or more layers, each layer of the one or more layers comprising one or more corresponding group III-V piezoelectric semiconductor materials, wherein the one or more layers includes a first layer comprising a single crystal material, a second layer comprising a polycrystalline material, and a third layer comprising a single crystal material, the third layer over the first layer and the second layer, the structure having a first portion on the substrate and a second portion suspended above the substrate;
a first electrode on a top surface of the second portion of the structure;
a second electrode on a bottom surface of the second portion of the structure; and
a plurality of electrodes over a top surface of the first portion of the structure.

* * * * *